United States Patent
Carpenter et al.

(10) Patent No.: US 10,513,197 B1
(45) Date of Patent: Dec. 24, 2019

(54) VEHICLE ELECTRICAL PORT INDICIA

(71) Applicant: Ford Global Technologies, LLC, Dearborn, MI (US)

(72) Inventors: Toussaint Carpenter, Dearborn, MI (US); Ryan Hunt, Ferndale, MI (US); Craig Edward Esler, Plymouth, MI (US); Dale Gilman, Beverly Hills, MI (US); Yevgeniya Sosonkina, Birmingham, MI (US); Henry F. Donald, Clarkston, MI (US); Francisco Damian Sanchez Patiño, Metepec (MX)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/132,727

(22) Filed: Sep. 17, 2018

(51) Int. Cl.
| | |
|---|---|
| *G08B 21/00* | (2006.01) |
| *B60L 53/16* | (2019.01) |
| *B60L 53/30* | (2019.01) |
| *B60L 53/60* | (2019.01) |
| *B60L 58/12* | (2019.01) |
| *B60Q 1/50* | (2006.01) |
| *B60Q 1/26* | (2006.01) |
| *G01R 31/36* | (2019.01) |
| *G01R 19/165* | (2006.01) |
| *B60L 3/00* | (2019.01) |

(52) U.S. Cl.
CPC .......... *B60L 53/16* (2019.02); *B60L 53/305* (2019.02); *B60L 53/60* (2019.02); *B60L 58/12* (2019.02); *B60Q 1/2661* (2013.01); *B60Q 1/50* (2013.01); *G01R 31/3646* (2019.01); *B60L 3/0023* (2013.01); *G01R 19/16542* (2013.01)

(58) Field of Classification Search
CPC ....................................................... B60L 53/16
USPC ......... 340/636.2, 636.1, 438, 469, 455, 693; 362/459, 486, 487, 540
See application file for complete search history.

(56) References Cited

U.S. PATENT DOCUMENTS

| | | | |
|---|---|---|---|
| 5,614,808 A * | 3/1997 | Konoya | H02J 7/0042 320/109 |
| 8,063,757 B2 | 11/2011 | Frey et al. | |
| 8,317,376 B2 | 11/2012 | Hook et al. | |
| 9,457,673 B2 | 10/2016 | Masuda et al. | |
| 2013/0021162 A1 * | 1/2013 | DeBoer | B60L 11/1816 340/635 |
| 2014/0253306 A1 * | 9/2014 | Gillespey | B60Q 1/00 340/425.5 |
| 2017/0197514 A1 * | 7/2017 | Rivas | B60L 11/1818 |
| 2017/0297442 A1 * | 10/2017 | Eisner | B60L 11/1818 |

* cited by examiner

*Primary Examiner* — Tai T Nguyen
(74) *Attorney, Agent, or Firm* — Brooks Kushman PC; David Kelley

(57) ABSTRACT

A vehicle includes an electrical port configured to transfer electricity between a vehicle battery and a charge station, the port including indicia viewable by operators of the port. The vehicle includes a controller configured to operate the indicia to flicker at a frequency that is proportional to a throughput level of a charge. The operation is responsive to receiving the charge.

11 Claims, 4 Drawing Sheets

VEHICLE ELECTRICAL PORT INDICIA

TECHNICAL FIELD

This disclosure relates to electrical port indicia for plugin vehicles.

BACKGROUND

Electric vehicles may be designed to receive an electric charge from a charge station. The charge station provides electricity for charging batteries of the electric vehicle. The charge station may provide a variety of throughputs that are denoted by voltage, current, or power. Throughput may be categorized through industry standard designations (e.g., Level 1, Level 2, DC Fast). Operators of the vehicle and charging station may be unable to determine the throughput—and other parameters—while engaging the charge cable of the charge station to a port of the vehicle.

SUMMARY

A vehicle includes an electrical port configured to transfer electricity between a vehicle battery and a charge station, the port including indicia viewable by operators of the port. The vehicle includes a controller configured to operate the indicia to flicker at a frequency that is proportional to a throughput level of a charge. The operation is responsive to receiving the charge.

A vehicle includes a port configured to transfer electricity between a station and a battery, and including indicia forming a contour having a shape substantially similar to the port where segments of the contour collectively indicate a maximum capacity of the battery as a port shape. The vehicle includes a controller configured to alter the indicia to mark a charge restriction on segments of the capacity proportionate to the charge restriction. The alteration is responsive to a charge restriction.

A vehicle includes a port configured to transfer electricity between a station and a battery, and including indicia forming a contour having a shape substantially similar to the port where segments of the contour collectively indicate a maximum capacity of the battery as a port shape. The vehicle includes a controller configured to alter the indicia symbolizing that a scheduled charge event is pending without electricity transfer. The alteration is responsive to cable insertion before the scheduled charge event is active.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Electric vehicles include a charge port that enables the transfer of electricity from a charge station to a vehicle battery. The port is generally outside of the vehicle. To insert a charge cable, an operator must exit the vehicle cabin and open the charge port door, inhibiting access to cabin indicators and information. As such, once the operator exits the cabin, the operator is unable to determine proper operation of the charge station and charge port, or to determine the battery status.

Federal requirements or design constraints may prevent substantial alternation of the port and port housing. As such, the port itself may be configured to convey information without substantial modification to the port footprint or port housing. The port may include indicia (e.g., lights, marquees, sound producers, haptic vibrators). The indicia may provide an indication of the maximum charge capacity of the battery (i.e., how much charge the battery is capable of holding). The indicia may provide an indication of the battery state of charge (i.e., the amount of charge currently stored in the battery). The indicia may follow a contour of the port. The contour may outline the port, portions of the port, or otherwise draw attention to the port. Such indicia may be configured to indicate charge throughput, operation status, scheduled charge status, locked cable status, battery maximum charge capacity, battery state of charge, and other parameters. Indeed, the indicia may have a shape substantially similar to the shape of the port to indicate operating parameters without substantial alteration to the port footprint or port housing.

Figure 1:
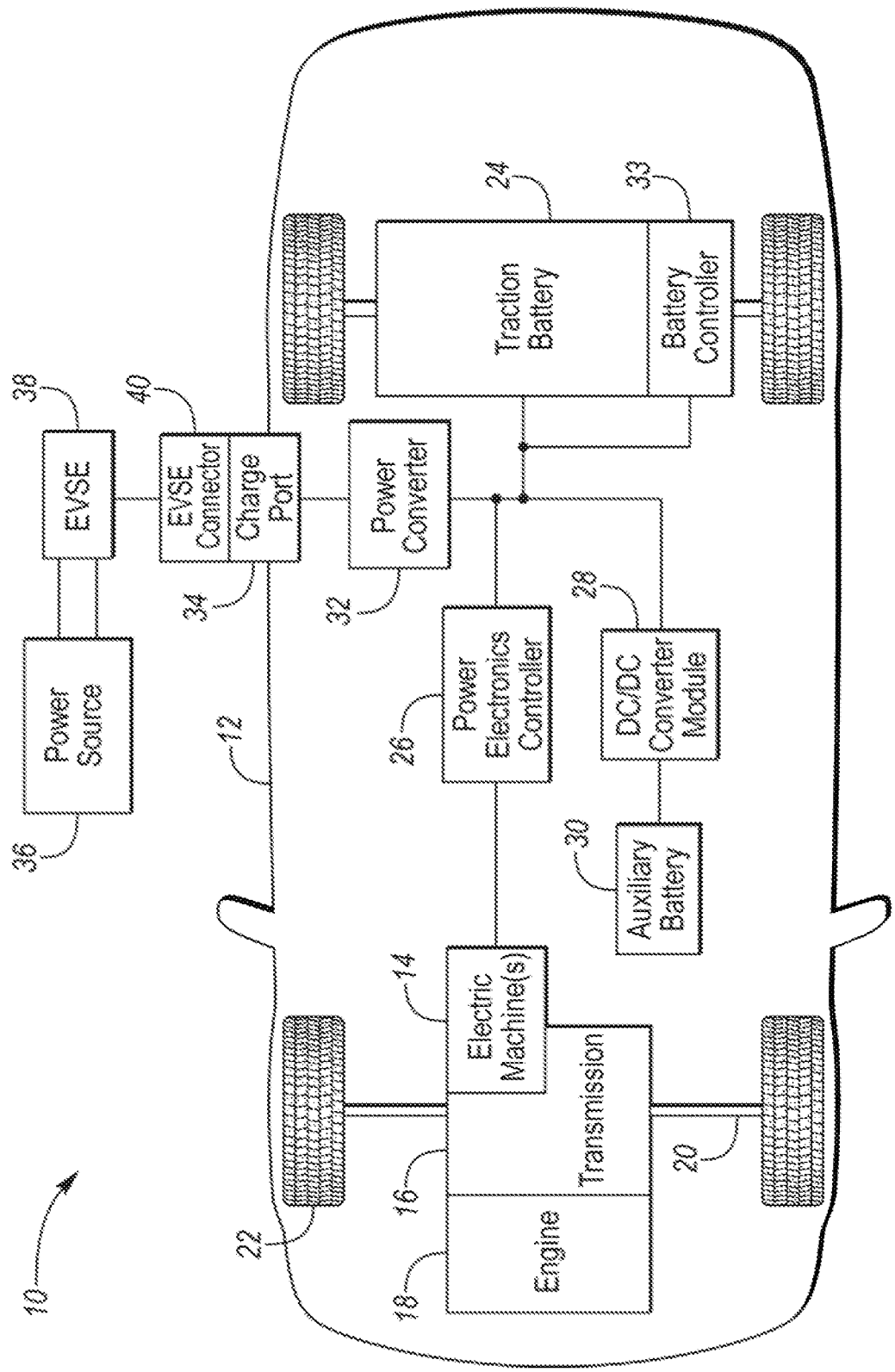
FIG. 1 is a schematic of a vehicle having a charge port.

FIG. 1 depicts a block diagram 10 illustrating a vehicle 12 comprising one or more electric machines 14 mechanically connected to a hybrid transmission 16. The electric machines 14 may be capable of operating as a motor or a generator. In addition, the hybrid transmission 16 may be mechanically connected to an engine 18. The hybrid transmission 16 may also be mechanically connected to a drive shaft 20 that is mechanically connected to the wheels 22. The electric machines 14 can provide propulsion and deceleration capability when the engine 18 is turned on or off. The electric machines 14 may also act as generators and may provide fuel economy benefits by recovering energy that would normally be lost as heat in the friction braking system. The electric machines 14 may also provide reduced emissions since the hybrid-electric vehicle 12 may be operated in electric mode or hybrid mode under certain conditions to reduce overall fuel consumption of the vehicle 12.

A traction battery (or battery pack) 24 stores and provides energy that may be used by the electric machines 14. The traction battery 24 may provide a high voltage DC output from one or more battery cell arrays, sometimes referred to as battery cell stacks, within the traction battery 24. The battery cell arrays may include one or more battery cells.

The traction battery 24 may be electrically connected to one or more power electronics controllers 26 through one or more contactors (not shown). The one or more contactors isolate the traction battery 24 from other components when opened and connect the traction battery 24 to other components when closed.

The power electronics controller 26 may also be electrically connected to the electric machines 14 and may be configured to bi-directionally transfer electrical energy between the traction battery 24 and the electric machines 14. For example, the traction battery 24 may provide a DC voltage while the electric machines 14 may require a three-phase AC voltage to function. The power electronics controller 26 may convert the DC voltage to a three-phase AC voltage as required by the electric machines 14. In a regenerative mode, the power electronics controller 26 may convert the three-phase AC voltage from the electric machines 14 acting as generators to the DC voltage required by the traction battery 24. Portions of the description herein are equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A DC/DC converter 28 may convert high voltage DC output of the traction battery 24 to a low voltage DC supply that is compatible with other vehicle loads. Other high-voltage loads, such as compressors and electric heaters, may be connected directly to the high-voltage without the use of the DC/DC converter 28. The low-voltage systems may be electrically connected to an auxiliary battery 30 (e.g., 12V battery).

A battery control module 33 may be in communication with the traction battery 24. The battery controller 33 may be configured to monitor and manage operation of the traction battery 24, such as via an electronic monitoring system (not shown) that manages temperature and charge state of each of the battery cells.

The vehicle 12 may be, for example, an electrified vehicle that includes components for a plug-in hybrid electric vehicle (PHEV), a full hybrid electric vehicle (FHEV), a mild hybrid electric vehicle (MHEV), or a battery electric vehicle (BEV). The traction battery 24 may be recharged by an external power source 36. The external power source 36 may be a connection to an electrical outlet. The external power source 36 may be electrically connected to electric vehicle supply equipment (EVSE) or charge station 38. The charge station 38 may provide circuitry and controls to regulate and manage the transfer of electrical energy between the power source 36 and the vehicle 12. The external power source 36 may provide DC or AC electric power to the charge station 38.

The charge station 38 may have a charge connector or cable 40 for plugging into a charge port 34 of the vehicle 12. The charge port 34 may be any type of port configured to transfer power from the charge station 38 to the vehicle 12. The charge port 34 may be electrically connected to a charger or on-board power converter 32. The power converter 32 may condition the power supplied from the charge station 38 to provide the proper voltage and current levels to the traction battery 24. The power converter 32 may interface with the charge station 38 to coordinate the delivery of power to the vehicle 12. The charge station connector 40 may have pins that mate with corresponding recesses of the charge port 34.

Figure 2:
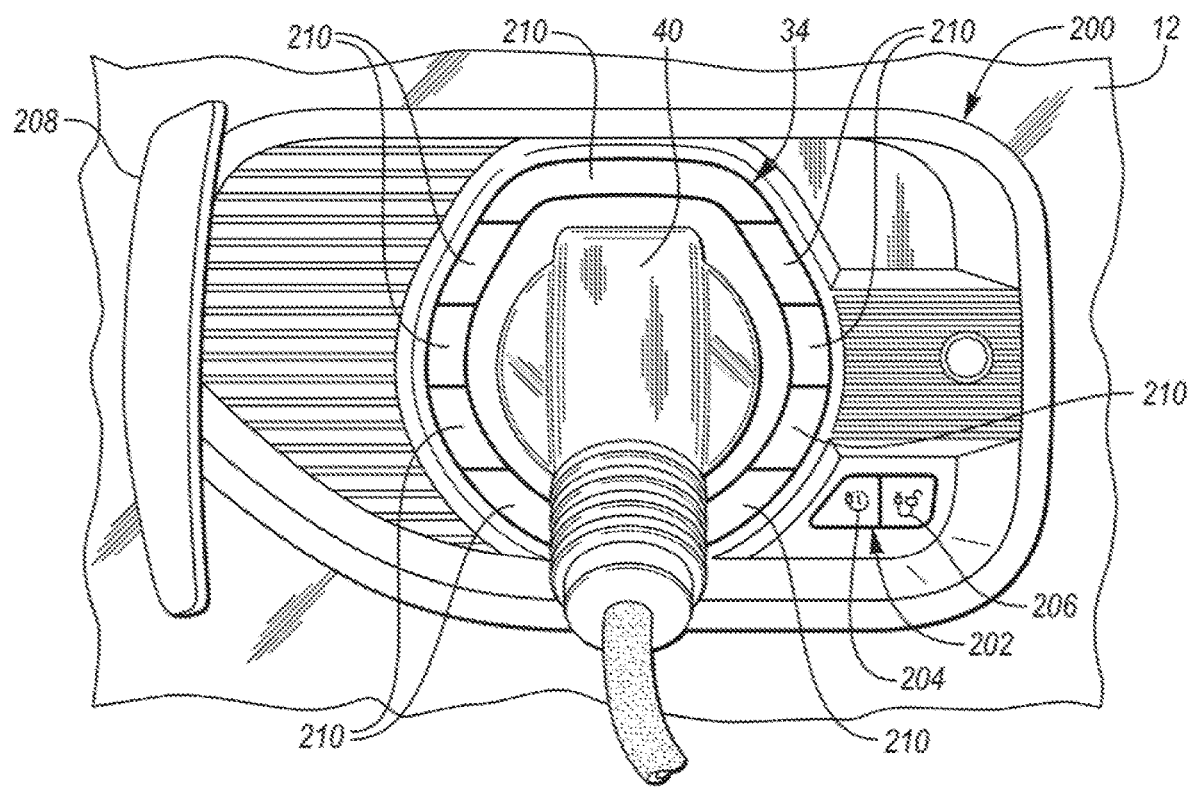
FIG. 2 is a perspective view of a charge port including indicia viewable by operators of the port.

Referring to FIG. 2, a charge port housing 200 is shown on the body of vehicle 12. The charge port housing 200 includes a charge port 34. The charge port 34 receives a charge cable or EVSE connector 40. The charge port 34 may be configured to receive AC and DC charge cables or combinations thereof. The charge port housing 200 may include a door 208 that can be opened to provide access to the charge port 34 or closed to cover the charge port 34 and protect it from the elements. The charge port housing 200 or indicia 210 may be operable to enable an operator to selectively override a scheduled charge event and begin charging the vehicle battery 24. As shown, the charge port housing 200 includes an interface 202. The interface 202 includes switches 204, 206 operable to enable the operator to override a scheduled charge event or lock the charge cable 34 in the charge port 40. The switches may be separate and distinct from the indicia 210 of the port 34, as shown, but still be considered indicia of the port 40. The interface 202 may be embedded as a portion of the indicia in the indicia 210 to provide the same functionality such that one or many of the indicia 210 are operable to enable interaction from an operator. The charge port 34 may include segments or portions therein of indicia 210.

As shown, the segments or portions of indicia 210 collectively form a contour of the charge port 34. Corresponding segments or portions of the indicia 210 may be on opposite sides of the charge port 34 as shown. The segments of indicia 210 collectively outline the charge port 34. The segments of indicia 210 may collectively indicate a maximum capacity of the battery 24 as port 34 shape. That is, the segments of indicia 210 when collectively activated, colorized, or lit indicate a full state of charge of the battery 24 as port shape or a user-defined charge limit, transforming the charge port 34 into state of charge indicia and operating parameter indicia. The maximum battery capacity may be a factory-standard capacity, determined capacity, assessed capacity, or other methods known in the art. The state of charge may be determined through coulomb counting, terminal voltage, ion profiles, or other methods known in the art.

The indicia may be operated as a fraction of a user-defined charge limit. The user may define the charge limit via an HMI or other implement. The fraction may be a ratio or portion of the overall maximum capacity. The maximum capacity of the battery may be represented on the indicia such that fully illuminated indicia represents a full battery charge. A user-defined charge limit may reduce the maximum capacity displayed on the indicia to the user-defined limit such that corresponding fractions or ratios are shown on the indication. That is, a 90% charge limit would prevent the battery from being charged above 90%. The maximum capacity on the indicia would be 90% because of the pending charge limit. Additionally, a 50% indication on the indicia would actually correspond to a 45% battery state of charge. Accordingly, a threshold may be set as a fraction of the total capacity or a fixed amount (e.g., 9/10 of battery capacity). The indicia may be fully illuminated at 90% SOC, indicating the threshold or charge limit is reached.

In such a case where the indicia are segmented as shown in FIG. 2, the controller may be further configured to only flicker segments of the indicia corresponding to a present percent state of charge relative the fraction. For example, if the battery state of charge is 45% and the threshold is 90%, as discussed above, the controller may be configured to flicker the segment that corresponds to 50% charge, indicating to the user that 50% of the threshold has been obtained. Further, the segment being flickered may represent a corresponding 40-60% charge that encompasses the 50% relative charge requiring the indication. Therefore, the segment having a band that encompasses the relative or respective charge percentage is flickered.

Figure 3:
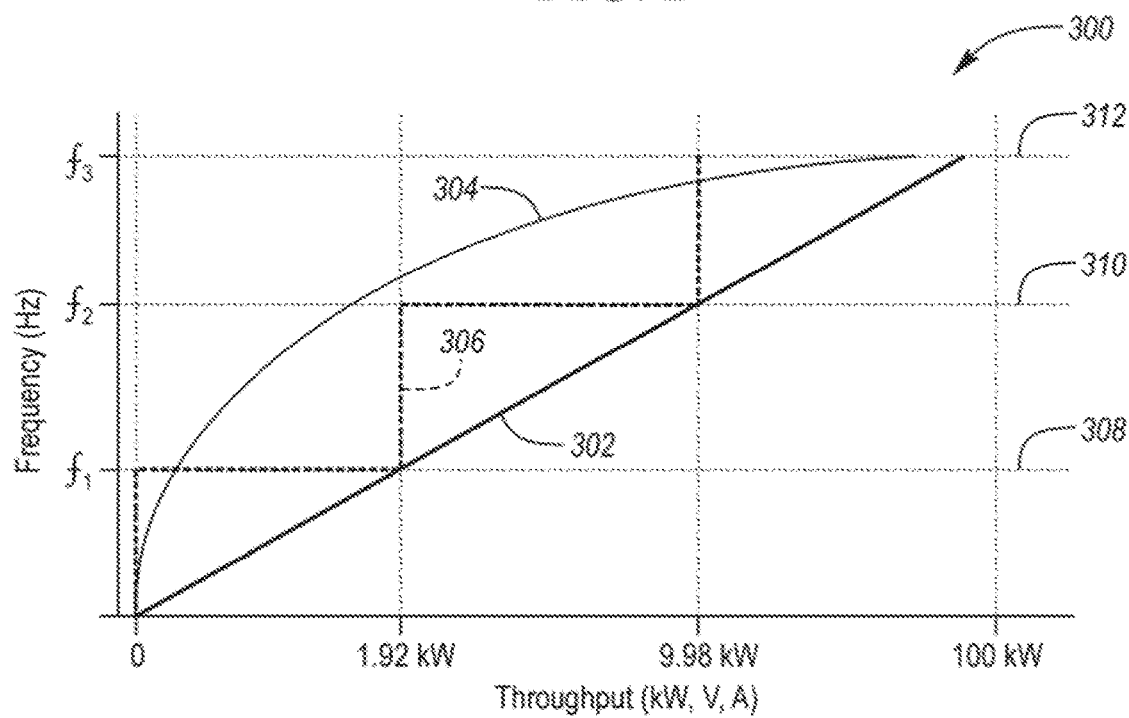
FIG. 3 is a graph indicating flicker frequency based on a linear or a non-linear function.

Referring to FIG. 3, a graph 300 is shown. The graph 300 depicts different flickering frequencies of the segments of indicia 210, as shown on the Y-axis, based on a throughput of the charge port 34, as shown on the X-axis. Flickering may refer to any type of pulsing, oscillating, blinking, or flashing the energization of the segments of indicia 210. The frequency of the flicker may be in Hertz (Hz). Throughput, as shown, may be any type of assessment of energy being transferred through the charge port 34. The throughput may be measured as power through the port 34 in kilowatts (kW). The throughput may be measured as voltage at the port in volts (V). For example, voltages may range from 110-120 VAC, 220 VAC, or 500 VDC. The throughput may be measured as current through the port. Additional energization quantities may be used.

The linear function 302 shows frequency increasing proportionally to throughput. As the amount of energy through the port 34 increases, the flicker frequency of the segments of indicia 210 increases. Flicker frequency could apply to any of the aforementioned indicia mediums. For example, in the haptic sense, the flicker frequency could relate to a vibration frequency of the indicia 210 on port 34. The flicker frequency could also relate to a tone frequency of the indicia on port 34. The flicker frequency may be associated with levels 308, 310, 312 of throughput in relation to port 34. For example, the first level frequency, $f_1$ 308, may be associated with a Level 1 throughput. The Level 1 throughput may be the same as described in SAE J1772 (i.e., 110 VAC). That is, when zero to 110 VAC is detected, the flicker frequency is $f_1$ 308. The Level 1 frequency, $f_1$ 308, may also be associated with a power throughput between zero and 1.92 kW.

The Level 2 throughput may be the same as described in SAE J1772 (i.e., 220 VAC). That is, when 110 VAC to 220 VAC is detected, the flicker frequency is $f_2$ 310. The Level 2 frequency, $f_2$ 310, may also be associated with a power throughput between 1.92 kW and 9.98 kW. The Level 3 throughput may be above that described in SAE J1772 (i.e., DC Fast Charging). That is, when DC voltage is detected at port 34, the flicker frequency is $f_3$ 312. The Level 3 frequency, $f_3$ 312, may also be associated with a power throughput above 10 kW. The flicker frequency may be associated with the throughput level through a non-linear function 304. The non-linear function 304 may provide greater visibility of the frequency levels 308, 310, 312 associated with curve 306.

Figure 4A:
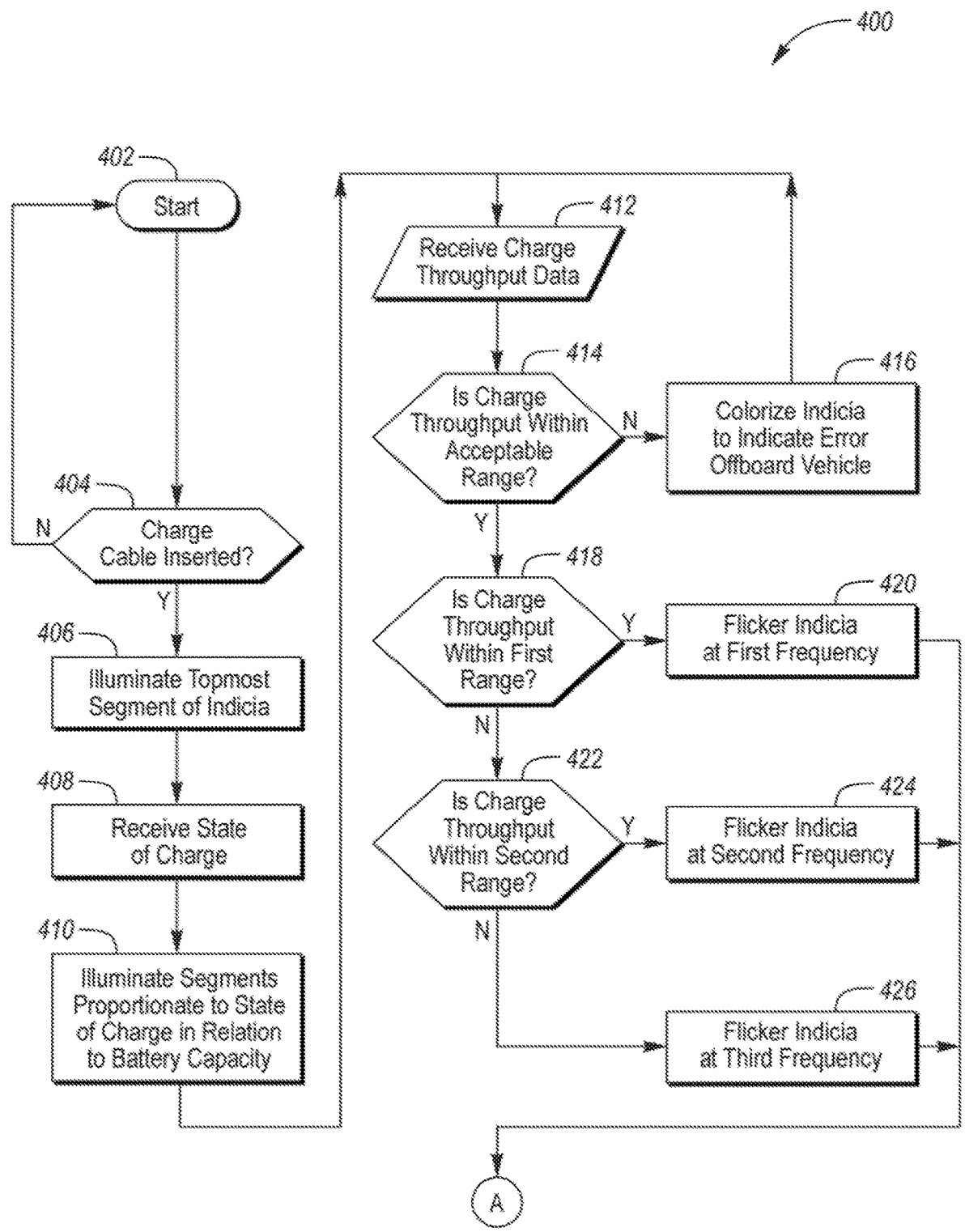
FIG. 4A is a first portion of an algorithm for operating the indicia.
Figure 4B:
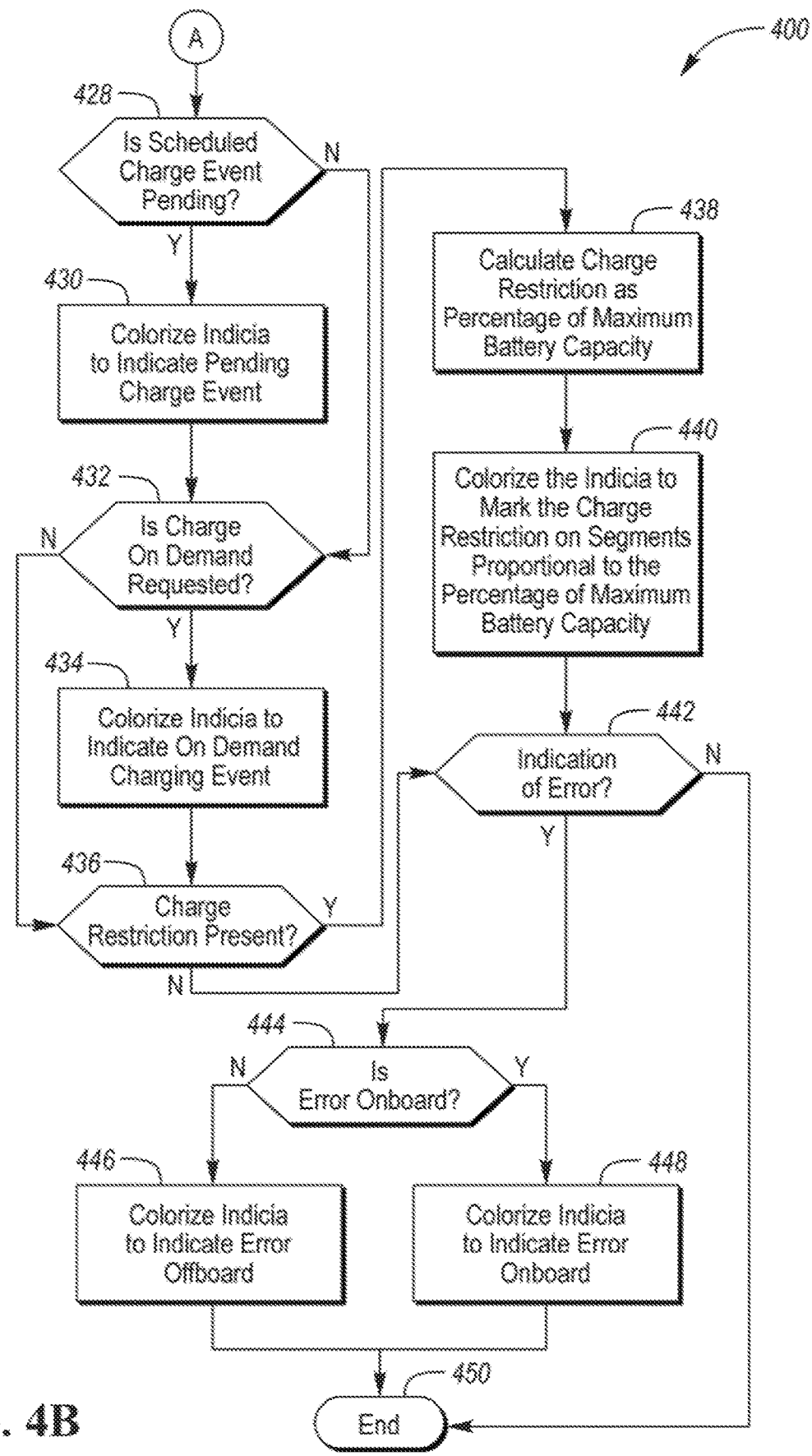
FIG. 4B is a second portion of an algorithm for operating the indicia.

Referring to FIGS. 4A-4B, an algorithm 400 is shown. In step 402 the algorithm 400 begins. In step 404, the controller—either the power electronics controller 26, battery controller 33, combination thereof, or separate controller (e.g., BCCM or DCGM (not shown))—detects the presence of a charge cable 40. To acknowledge the presence of the charge cable 40, the controller may energize or illuminate one of the segments of the indicia 210 to indicate that the charge cable 40 is inserted. At this time, the operator may press one of the switches 206 to lock the cable in place. In step 408, a controller receives a state of charge from the battery controller 33 or another controller. The controller may illuminate segments proportionate to the state of charge in relation to battery capacity in step 410. As an analogy, segments of indicia 210 would form a container sized port indicating the battery capacity and segments of the indicia 210 would be illuminated analogous to liquid filling the container, or port, to indicate the state of charge.

In step 412, the controller receives charge throughput data. The charge throughput data may merely provide an indication of intended throughput based on voltage or other constraints of the EVSE 38. For example, a DC fast charge indicating a flicker frequency of $f_3$, may require payment from an operator before providing indication of DC fast charge throughput. That is, the EVSE 38 may have different throughput thresholds based on payment. The standard charge rate from the EVSE 38 may have a throughput that would fall within the flicker frequency of $f_1$. An operator may pay to upgrade from the standard charge rate to a DC fast charge because the operator needs to expedite the charge. In such a circumstance, data communication between the EVSE 38 and the charge port 34 may occur according to the SAE J1772 standard or other protocols (e.g., WiFi, Bluetooth). In step 414, if the charge throughput is outside of an acceptable range (e.g., negative) the controller will colorize segments of the indicia 210 to indicate that the error is offboard the vehicle 10 in step 416. If the charge throughput is within the acceptable range in step 414, the controller will determine whether the charge throughput is within a first range in step 418. If the charge throughput is within the first range, the controller will flicker the indicia 210 at a first frequency in step 420. If not, the controller will determine whether the charge throughput is within a second range in step 422. If the charge throughput is within the second range, the controller will flicker the indicia 210 at a second frequency in step 424. Otherwise, the controller will flicker the indicia 210 at a third frequency 426. It should be appreciated that the indicia 210 may flicker as previously disclosed according to linear and non-linear functions. Any of the steps discussed in algorithm 400 may be omitted or rearranged.

In step 428, the controller determines whether a scheduled charge event is pending. If the scheduled charge event is pending, the controller will colorize the indicia 210 to indicate the pending charge event. The indicia 210 will indicate the state of charge of the battery 24 proportionate to the maximum capacity of the battery 24 as a unique color, indicating that a scheduled charge event is pending, in step 430. In step 432, responsive to the charge override switch 204 being pressed, the controller will alter the indicia 210 to indicate that fast charging is requested. The indicia 210 will indicate the state of charge of the battery 24 proportionate to the maximum capacity of the battery 24 as a unique color, indicating that a scheduled charge event is pending, in step 434.

In step 436, the controller determines whether a charge restriction is present. If a charge restriction is present, the controller will calculate the charge restriction as a percentage of the maximum battery capacity 438. As stated above, the indicia 210 will indicate the state of charge of the battery 24 proportionate to the maximum capacity of the battery 24 such that the state of charge fills the indicia from the bottom up. With the calculated charge restriction amount, the controller will colorize—from the top of the port 34 down—the indicia 210 corresponding to the representative portion of the restriction. That is, the calculated restriction amount will be shown as a color different than that of the state of charge amount. Any unrestricted or uncharged portion of the maximum capacity of the battery will be unilluminated on the indicia 210 between the unrestricted portion and the uncharged portion, according to step 440.

In step 442, the controller determines whether an error or fault is present. The error or fault may be any standard or non-standard error associated with the SAE J1772 standard. If an error is present, the controller determines whether the error is onboard or offboard in step 444. If the error is offboard, the controller will colorize the indicia as a unique solid color to signify and provide notification that the error is offboard in step 446. If the error is onboard, the controller will colorize the indicia as a unique solid color to signify that the error is onboard in step 448. In step 450 the algorithm 450 ends or repeats.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
    a port;
    indicia surrounding the port; and
    a controller configured to, responsive to a charging cable being connected to the port before a scheduled charge event is active, illuminate at least a portion of the indicia in a first color symbolizing that the scheduled charge event is pending without electricity transfer, and illuminate corresponding portions of the indicia to indicate a present state of charge relative to a user-defined charge limit in a second color, wherein a portion of the indicia is operable to enable a user to override the scheduled charge event and begin charging.

2. The vehicle of claim 1, wherein the controller is further configured to, responsive to receiving a direct current (DC) connection to the port, operate the indicia to provide notification that the scheduled charge event is overridden and begin charging.

3. A vehicle comprising:
    a charging port;
    indicia surrounding at least a portion of the charging port; and
    a controller configured to, responsive to the charging port receiving a charge cable and a charge restriction being active, operate the indicia to provide indication of the charge restriction proportionate to a ratio of the charge restriction and a maximum battery capacity of a vehicle battery.

4. The vehicle of claim 3 wherein the controller is further configured to illuminate corresponding portions of the indicia to indicate a present state of charge as a fraction of a user-defined charge limit.

5. The vehicle of claim 4 wherein the controller is further configured to illuminate the indicia in a first color associated with a first charging rate, and a second color associated with a second charging rate.

6. The vehicle of claim 4 wherein the controller is further configured to flicker the indicia at a first frequency associated with a first charging rate, and a second frequency associated with a second charging rate.

7. A vehicle comprising:
    a port configured to transfer electricity between a battery and a station;
    segmented indicia forming an outline having a same shape as and surrounding at least some of the port, and collectively indicating a maximum capacity of the battery; and
    a controller configured to, responsive to a charge restriction, illuminate a number of the segments proportional to the charge restriction, wherein the controller is further configured to, responsive to the port receiving a charge cable before a scheduled charge event is active, operate the indicia to provide notification that the scheduled charge event is pending without charging current present.

8. The vehicle of claim 7, wherein the controller is further configured to, responsive to receiving a fault, operate the indicia to provide notification of the fault occurring onboard the vehicle with a colorization other than a colorization of the fault occurring offboard the vehicle.

9. The vehicle of claim 7, wherein the controller is further configured to:
    responsive to receiving a charge throughput level within a first range, operate the indicia to flicker at a first frequency; and
    responsive to receiving a charge throughput level within a second range, operate the indicia to flicker at a second frequency.

10. The vehicle of claim 9, wherein the controller is further configured to operate the indicia to flicker at a third frequency.

11. The vehicle of claim 7, wherein the controller is further configured to, responsive to receiving a direct current (DC) connection to the port, operate the indicia to provide notification that the scheduled charge event is overridden and begin charging the battery.

\* \* \* \* \*